(12) United States Patent
Tan et al.

(10) Patent No.: US 9,748,197 B2
(45) Date of Patent: Aug. 29, 2017

(54) METHODS FOR PACKAGING INTEGRATED CIRCUITS

(71) Applicant: Altera Corporation, San Jose, CA (US)

(72) Inventors: Loon Kwang Tan, Kepala Batas (MY); Yuanlin Xie, Fremont, CA (US); Ping Chet Tan, Gelugor (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/192,760

(22) Filed: Jun. 24, 2016

(65) Prior Publication Data

US 2016/0307868 A1 Oct. 20, 2016

Related U.S. Application Data

(63) Continuation of application No. 14/175,651, filed on Feb. 7, 2014, now Pat. No. 9,401,287.

(51) Int. Cl.
*H01L 23/00* (2006.01)
*H01L 21/56* (2006.01)
(Continued)

(52) U.S. Cl.
CPC .......... *H01L 24/73* (2013.01); *H01L 21/4857* (2013.01); *H01L 21/568* (2013.01); *H01L 21/6836* (2013.01); *H01L 23/36* (2013.01); *H01L 24/16* (2013.01); *H01L 24/32* (2013.01); *H01L 24/48* (2013.01); *H01L 23/3128* (2013.01); *H01L 23/49827* (2013.01); *H01L 24/13* (2013.01); *H01L 24/29* (2013.01); *H01L 24/45* (2013.01); *H01L 24/81* (2013.01); *H01L 24/83* (2013.01); *H01L 24/85* (2013.01); *H01L 24/92* (2013.01); *H01L 2221/68372* (2013.01); *H01L 2224/04042* (2013.01); *H01L 2224/131* (2013.01); *H01L 2224/1624* (2013.01); *H01L 2224/16225* (2013.01); *H01L 2224/291* (2013.01); *H01L 2224/2919* (2013.01); *H01L 2224/3224* (2013.01); *H01L 2224/32225* (2013.01); *H01L 2224/32245* (2013.01);
(Continued)

(58) Field of Classification Search
CPC .... H01L 24/73; H01L 21/4857; H01L 21/568
USPC .......................... 257/684; 438/107, 118, 126
See application file for complete search history.

(56) References Cited

U.S. PATENT DOCUMENTS 7,638,879 B2   12/2009  Jiang et al.
9,142,434 B2    9/2015  Gao
(Continued)

FOREIGN PATENT DOCUMENTS

CN   1144016 A    2/1997
CN   2570981 Y    9/2003
(Continued)

*Primary Examiner* — Errol Fernandes

(57) ABSTRACT

Techniques for packaging an integrated circuit include attaching a die to a conductive layer before forming dielectric layers on an opposing surface of the conductive layer. The conductive layer may first be formed on a carrier substrate before the die is disposed on the conductive layer. The die may be electrically coupled to the conductive layer via wires or solder bumps. The carrier substrate is removed before the dielectric layers are formed. The dielectric layers may collectively form a coreless package substrate for the integrated circuit package.

10 Claims, 11 Drawing Sheets

(51) Int. Cl.
*H01L 21/48* (2006.01)
*H01L 21/683* (2006.01)
*H01L 23/36* (2006.01)
*H01L 23/31* (2006.01)
*H01L 23/498* (2006.01)

(52) U.S. Cl.
CPC ............... *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48229* (2013.01); *H01L 2224/48247* (2013.01); *H01L 2224/73204* (2013.01); *H01L 2224/73215* (2013.01); *H01L 2224/73253* (2013.01); *H01L 2224/73265* (2013.01); *H01L 2224/81005* (2013.01); *H01L 2224/81192* (2013.01); *H01L 2224/83005* (2013.01); *H01L 2224/83851* (2013.01); *H01L 2224/85005* (2013.01); *H01L 2224/92125* (2013.01); *H01L 2224/92225* (2013.01); *H01L 2224/92247* (2013.01); *H01L 2924/12042* (2013.01); *H01L 2924/14* (2013.01); *H01L 2924/15192* (2013.01); *H01L 2924/15311* (2013.01); *H01L 2924/181* (2013.01); *H01L 2924/1815* (2013.01); *H01L 2924/18161* (2013.01); *H01L 2924/3511* (2013.01); *H01L 2924/364* (2013.01)

(56) References Cited

U.S. PATENT DOCUMENTS

| | | |
|---|---|---|
| 2011/0024887 A1 | 2/2011 | Chi et al. |
| 2011/0267789 A1 | 11/2011 | Chew |
| 2012/0001306 A1 | 1/2012 | Wang |
| 2013/0069241 A1 | 3/2013 | Lin et al. |
| 2013/0168850 A1* | 7/2013 | Samoilov .......... H01L 21/76898 257/737 |
| 2013/0252378 A1 | 9/2013 | Jeng et al. |

FOREIGN PATENT DOCUMENTS

| | | |
|---|---|---|
| EP | 0745270 | 12/1996 |
| EP | 2084739 | 8/2009 |
| WO | 9522172 | 8/1995 |
| WO | 2006072032 | 7/2006 |
| WO | 2008026077 | 3/2008 |
| WO | 2011087591 | 7/2011 |
| WO | 2013148925 | 10/2013 |

* cited by examiner

METHODS FOR PACKAGING INTEGRATED CIRCUITS

This application is a continuation of U.S. patent application Ser. No. 14/175,651, filed Feb. 7, 2014, which is hereby incorporated by reference herein in its entirety. This application claims the benefit of and claims priority to U.S. patent application Ser. No. 14/175,651, filed Feb. 7, 2014.

BACKGROUND

An integrated circuit (IC) die is generally packaged to protect the die from external contamination or physical damage. An IC package generally includes, among others, a substrate, a die placed on the substrate and a heat spreader placed over the die to dissipate heat from the IC package. The die may be assembled on the substrate in a flip-chip configuration or a wirebond configuration.

In the flip-chip configuration, the die is mounted on the substrate. The die is "flipped" when it is mounted on the substrate such that solder bumps on the die are positioned on corresponding contact pads on the substrate. In the wirebond configuration, the die is electrically coupled to the substrate via bonding wires. Signals from the integrated circuit die may then travel through the wires or solder bumps to the substrate.

As the die is mounted on the substrate, the substrate is formed first before the die is assembled on the fully formed substrate. Generally, a substrate is formed by multiple dielectric layers with a core layer sandwiched in between the dielectric layers. The core layer may provide mechanical support for the package structure when the die is mounted on substrate.

However, as demand for high speed applications grows, the core layer thickness is reduced to achieve better performance. In some instances, the core layer is entirely removed to obtain a coreless substrate. A coreless substrate is generally thinner and may provide better electrical performance. However, because the coreless substrate is thinner and does not include a stiff core layer, it may be more susceptible to warpage compared to a substrate with a core layer.

SUMMARY

Techniques for packaging integrated circuits (ICs) are provided. Embodiments of the present invention include techniques to form an IC package with a coreless package substrate.

It is appreciated that the present invention can be implemented in numerous ways, such as a process, an apparatus, a system, or a device. Several inventive embodiments of the present invention are described below.

A method of packaging an IC may include forming a conductive layer and attaching the IC die to a surface of the conductive layer. Multiple dielectric layers may be formed on an opposing surface of the conductive layer after the IC die is attached to the conductive layer. In one instance, the conductive layer may be formed on a carrier substrate before the IC die is assembled on the conductive layer. The carrier substrate is removed from the assembled IC die before the dielectric layers are formed.

Another method of packaging an IC includes forming a conductive layer on a carrier substrate and mounting the IC on the conductive layer. The IC may be connected to the conductive layer via wires or solder bumps. The IC is encapsulated within a molding compound before the carrier substrate is stripped away. A package substrate may be formed on an opposing surface of the conductive layer after the carrier substrate has been stripped away. In one embodiment, the package substrate may be a coreless package substrate.

In another embodiment, a method of forming a coreless package substrate includes attaching a conductive layer to a carrier substrate. The carrier substrate is then removed from the conductive layer. After the carrier substrate has been removed from the conductive layer, multiple dielectric layers are formed on a surface of the conductive layer. The multiple dielectric layers may collectively form a coreless package substrate.

DETAILED DESCRIPTION

The embodiments provided herein include techniques to package an integrated circuit (IC) with a coreless substrate.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
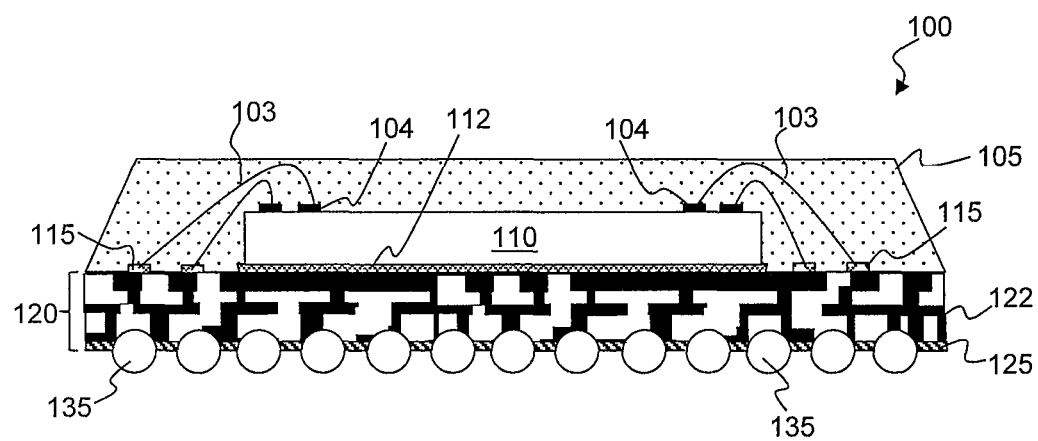
FIG. 1 shows an illustrative wirebond IC package in accordance with embodiments of the present invention.

FIG. 1 shows an illustrative wirebond IC package in accordance with embodiments of the present invention. As shown in FIG. 1, IC package 100 includes IC 110 and substrate 120. IC 110, disposed on a surface of substrate 120, is attached to substrate 120 with adhesive 112. It should be noted that adhesive 112 may be a conductive adhesive or solder in the form of paste. Bonding wires 103, which may electrically connect IC 110 to substrate 120, are attached to contact pads 104 on a surface of IC 110 and corresponding contact pads 115 on substrate 120. Commonly used wires are either made of gold (Au), aluminum (Al) or copper (Cu). Molding compound 105 encapsulates IC 110 and wires 103 to protect IC 110 and other components (not shown in FIG. 1) from moisture and external elements. As an example, molding compound 105 may be made of epoxy resin.

As is generally known, substrate 120 may be formed by multiple dielectric layers (not explicitly shown in FIG. 1). Routing paths 122 in substrate 120 may route signals to and from IC 110 through the multiple dielectric layers in substrate 120. Solder mask 125 may be formed on a bottom surface of substrate 120. Solder balls 135 on the bottom surface of substrate 120 allow IC 110 in IC package 100 to be connected to external circuit elements as signals from IC 110 are transmitted outside of IC package 100 by solder balls 135.

Figure 2:
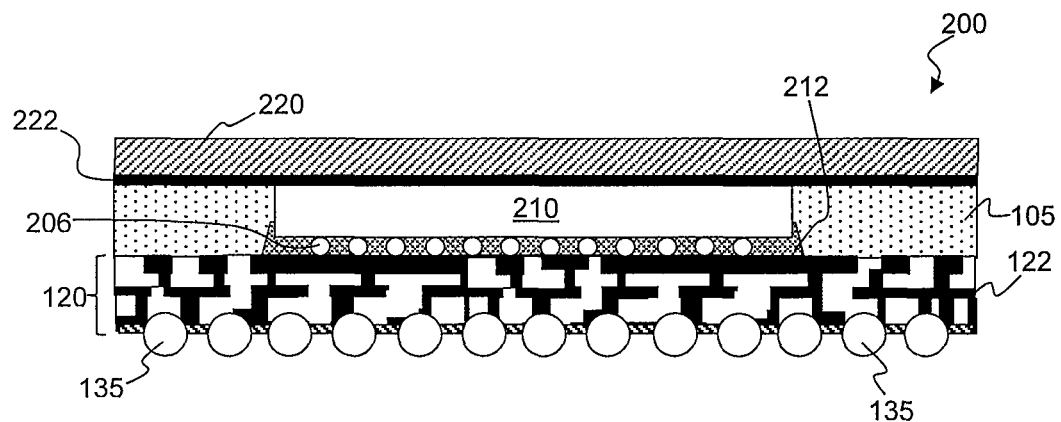
FIG. 2 shows an illustrative flip-chip IC package in accordance with embodiments of the present invention.

FIG. 2 shows an illustrative flip-chip IC package in accordance with embodiments of the present invention. In the embodiment of FIG. 2, IC package 200 includes flip-chip IC 210, substrate 120, molding compound 105, and heat spreader 220. It should be appreciated that IC package 200 shares similarities with IC package 100 of FIG. 1 and as such, elements that have been described above (e.g., molding compound 105, substrate 120, routing paths 122, and solder balls 135) are not repeated for the sake of brevity. Heat spreader 220 is placed over IC 210 to dissipate heat from IC package 200. Heat spreader 220 may be attached to IC 210 through a non-conductive adhesive 222.

It should be noted that IC 210 shown in FIG. 2 is a flip-chip die with microbumps 206 on one of its surfaces. Microbumps 206 connect IC 210 to substrate 120. It should be appreciated that the cavity between the microbumps 206 on substrate 120 may be filled with under-fill material 212 or sealing resin to fill the gap and protect the solder joints between microbumps 206 and substrate 120. As mentioned above, solder balls 135 on the bottom surface of substrate 120 may connect IC 210 in IC package 200 to other circuitry (e.g., a printed circuit board (PCB)). Thus, signals from IC 210 may be transmitted through routing paths 122 in substrate 120 before being transmitted outside of IC package 200 by solder balls 135.

Generally, an IC package, such as IC package 100 of FIG. 1 and IC package 200 shown in FIG. 2, may be formed by disposing an IC on a ready-made substrate. For instance, substrate 120, together with routing paths 122 and solder balls 135, may be formed before IC 210 (or IC 110 of FIG. 1) is assembled on the substrate. In some instances, assembling the IC on a ready-made substrate may cause warpage. It should be noted that a relatively thin substrate (e.g., a coreless substrate) may be more prone to warpage during the assembly process. Accordingly, in some embodiments, the IC may first be assembled before the substrate is formed. As an example, instead of attaching the IC on a fully formed substrate, the IC may first be assembled on a carrier before the substrate is built up after the formation of the IC and the removal of the carrier. FIGS. 3A, 3B and 4A-4N show steps for packaging a wirebond IC package in accordance with embodiments of the present invention.

Figure 3A:
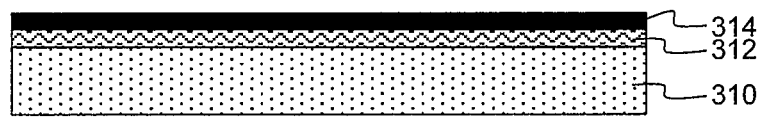
FIGS. 3A, 3B and 4A-4N show steps for packaging a wirebond IC package in accordance with embodiments of the present invention.
Figure 3B:
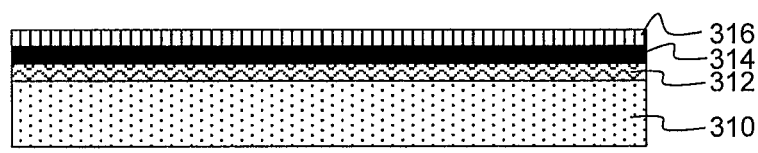

FIG. 3A shows carrier substrate 310 with conductive layer 314. For example, carrier substrate 310 may be an FR-4 glass epoxy substrate or a Bismaleimide-Triazine (BT) substrate or any other suitable epoxy resin paste. Conductive layer 314 may be a copper (Cu) foil that is attached to carrier substrate 310 via adhesive 312. As shown in FIG. 3B, after conductive layer 314 has been disposed on carrier substrate 310, the bottom surface of conductive layer 314 is laminated with dry film 316. At this stage, a mask (not shown) may be used in an image transfer process where a portion of dry film 316 is etched off.

Figure 4A:
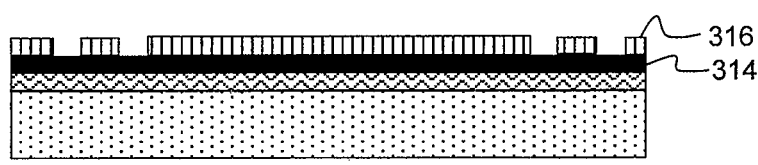
Figure 4B:
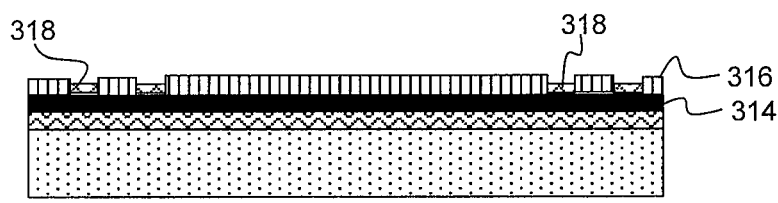
Figure 4C:
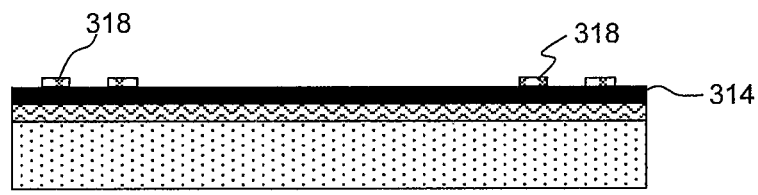
Figure 4D:
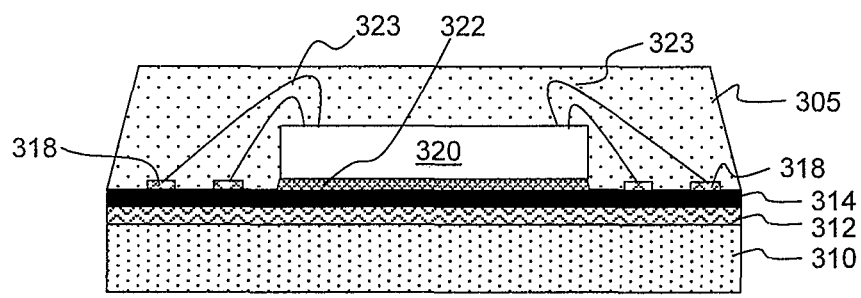

FIG. 4A shows dry film 316 on conductive layer 314 after the image transfer process. It should be noted that a portion of dry film 316 has been etched off to form contact pads for the wirebond IC in the later stages. FIG. 4B shows nikel-gold (NiAu) plating 318 (or alternatively, palladium (Pd) plating) on conductive layer 314, in areas where dry film 316 has been etched off. After the plating process, dry film 316 may be stripped away. FIG. 4C shows the resulting structure after dry film 316 (as shown in FIG. 4B) has been stripped away, leaving contact pads 318 on a surface of conductive layer 314. FIG. 4D shows the resulting structure after the chip assembly process. Wirebond IC 320 is disposed on the surface of conductive layer 314. Adhesive 322 may be used to attach wirebond IC 320 to conductive layer 314. Wires 323 electrically connect wirebond IC 320 to conductive layer 314 via contact pads 318. Wirebond IC 320 and wires 323 may then be encapsulated within molding compound 305.

Figure 4E:
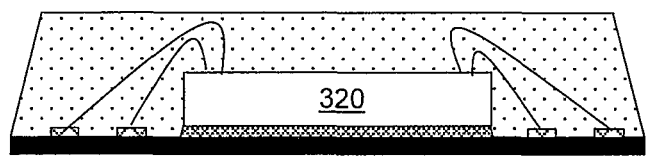

At this stage, the chip assembly process may be completed. Carrier substrate 310 that is attached to conductive layer 314 through adhesive 312 may be stripped away. It should be noted that carrier substrate 310 may be used as a base for the assembly of wirebond IC 320 to reduce warpage and may be removed once wirebond IC 320 has been attached. FIG. 4E shows the resulting structure after carrier substrate 310, together with adhesive 312, has been stripped away from the assembled wirebond IC 320.

Figure 4F:
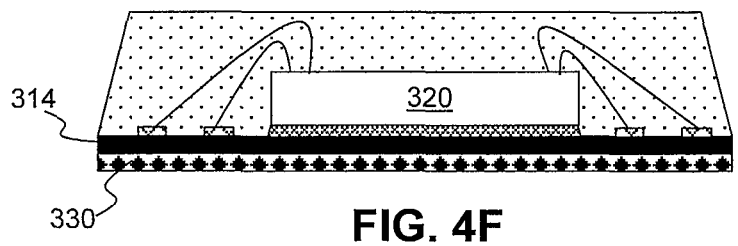
Figure 4G:
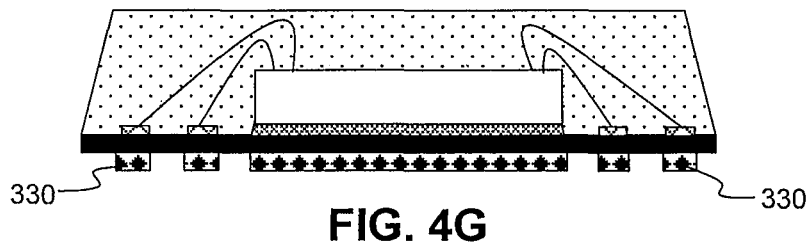
Figure 4H:
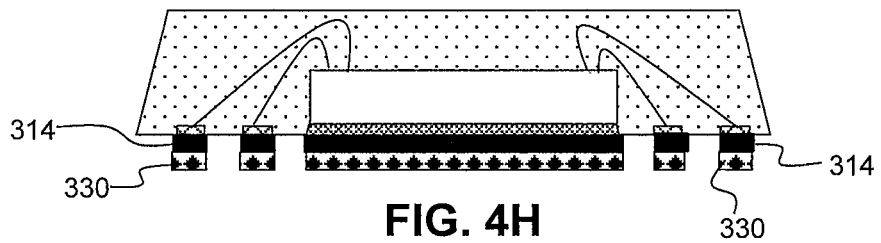
Figure 4I:
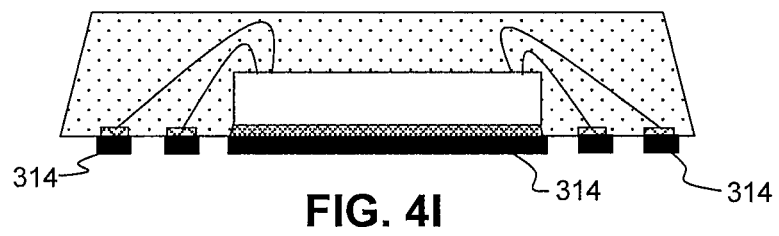
Figure 4J:
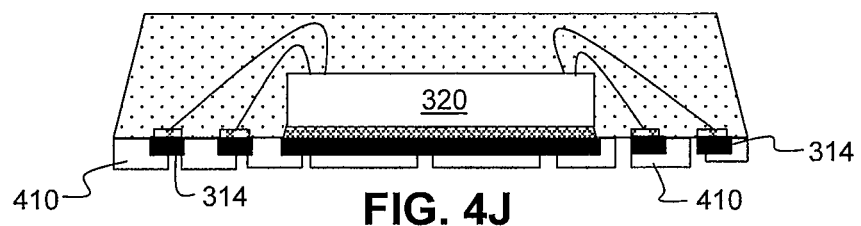
Figure 4K:
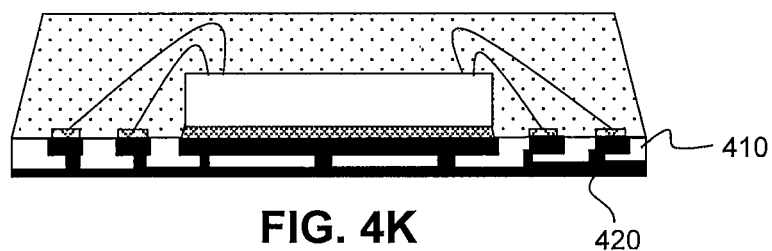
Figure 4L:
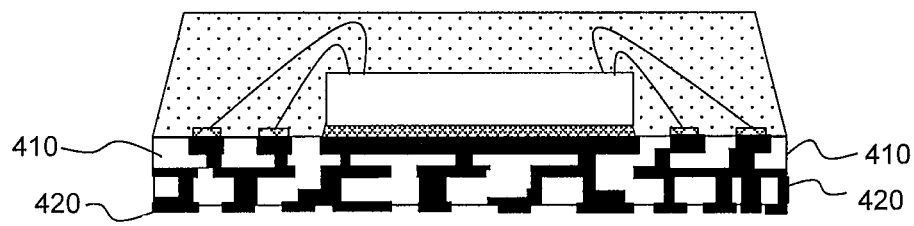

Subsequent steps in FIGS. 4F-4N show the substrate formation process on the bottom of the assembled wirebond IC 320. FIG. 4F shows a layer of dry film 330 laminated to a bottom surface of conductive layer 314. After the lamination process, an image transfer process is carried out. FIG. 4G shows the resulting dry film 330 with etched of portions after the image transfer process. Next, a portion of conductive layer 314 may be etched away. FIG. 4H shows the resulting structure after the etching process. Dry film 330 is then stripped away from conductive layer 314 in FIG. 4I. Subsequently, as shown in FIG. 4J, a dielectric layer 410 (e.g., BT or film-type dielectric) is laminated on the remaining conductive layer at the bottom of the assembled wirebond IC 320. It should be noted that FIG. 4J shows dielectric layer 410 after a laser drilling process has been performed. FIG. 4K shows the structure after a metal plating (e.g., Cu plating) process to form conductive paths 420 in dielectric layer 410. FIG. 4L shows the structure after subsequent build-up dielectric layers 410 and routing paths 420 have been formed. It should be noted that specific steps or specific materials involved in the build-up process are not described in detail herein in order to not unnecessarily obscure the present invention.

Figure 4M:
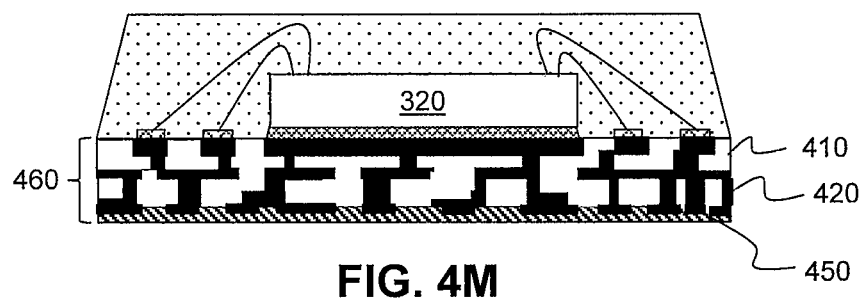
Figure 4N:
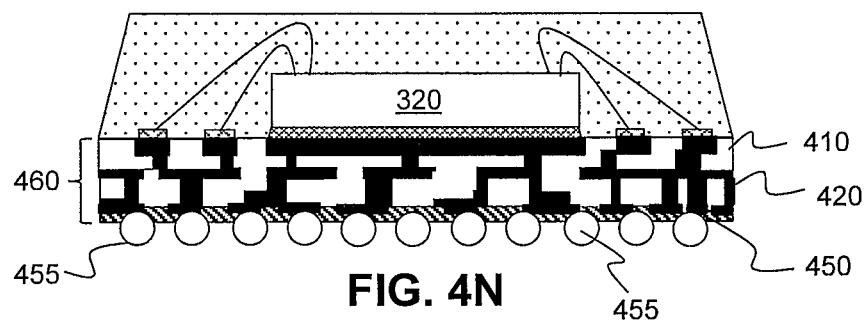

FIG. 4M shows solder mask 450 printed on the bottom layer of build-up dielectric layers 410. In one embodiment, at this stage, build-up dielectric layers 410, routing paths 420, and solder mask 450 collectively form a coreless substrate 460 for assembled wirebond IC 320. In some instances, solder mask 450 may be removed before solder balls are mounted on the bottom of substrate 460. FIG. 4N shows the resulting wirebond IC package after solder balls 455 have been mounted on substrate 460. As explained above with reference to FIG. 1, signals from wirebond IC 320 may travel through routing paths 420 in substrate 460 to solder balls 455.

Figure 5A:
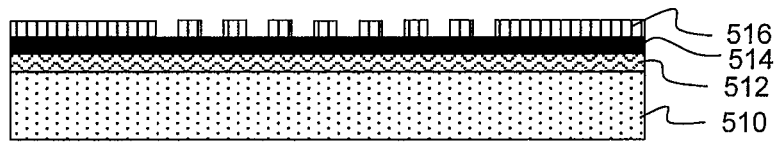
FIGS. 5A-5P show steps for packaging a flip-chip IC in accordance with embodiments of the present invention.
Figure 5B:
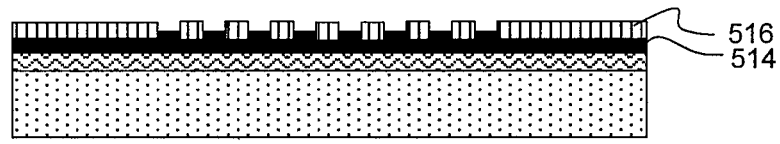
Figure 5C:
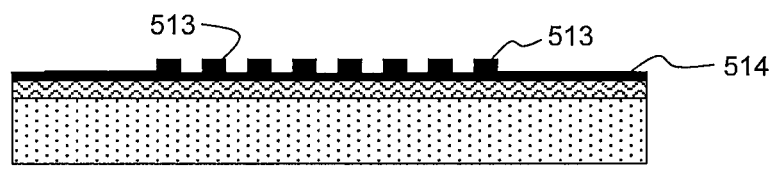
Figure 5D:
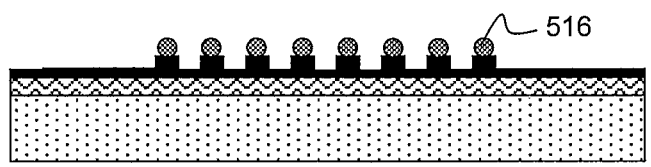
Figure 5E:
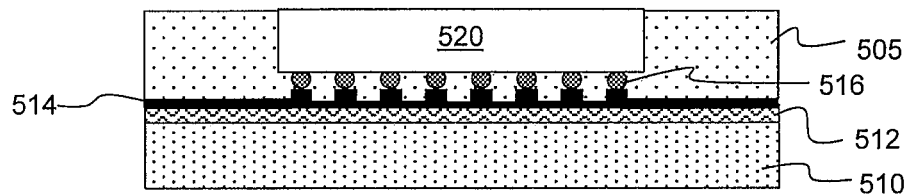
Figure 5F:
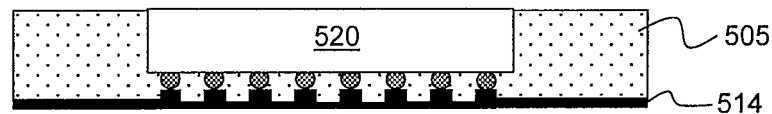
Figure 5G:
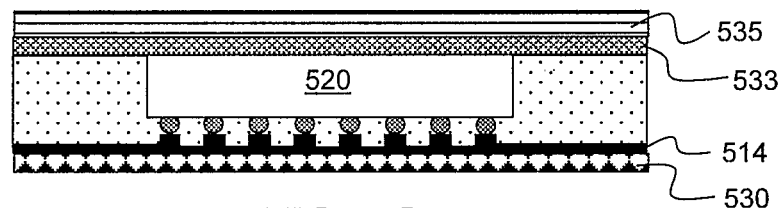
Figure 5H:
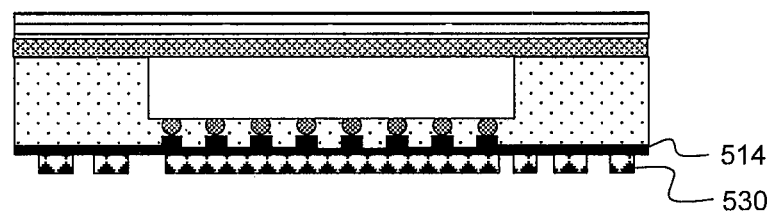
Figure 5I:
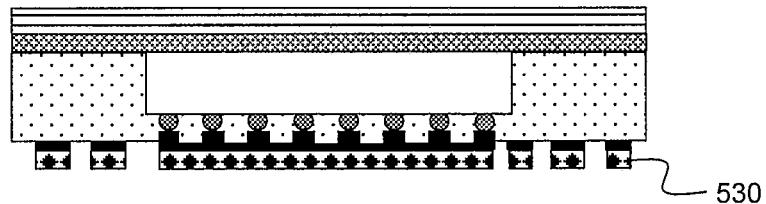
Figure 5J:
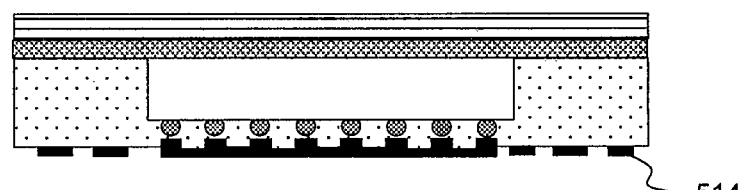
Figure 5K:
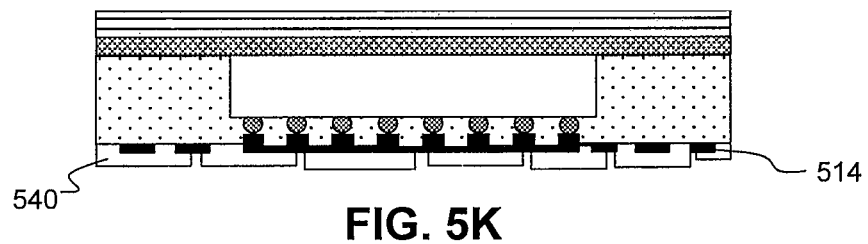
Figure 5L:
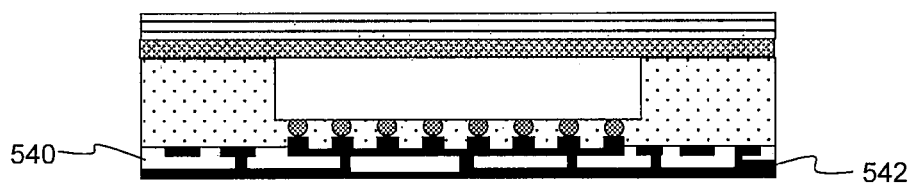
Figure 5M:
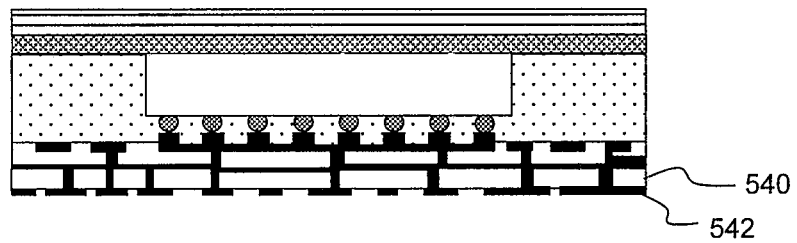
Figure 5N:
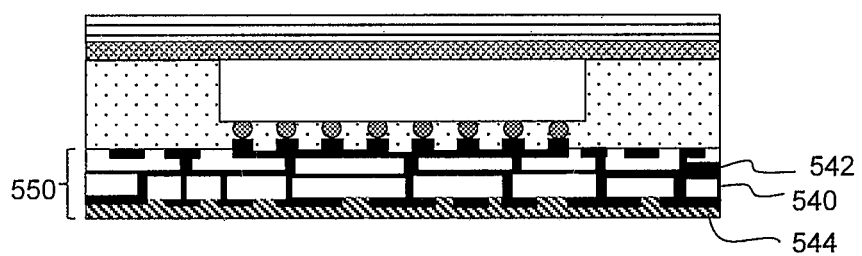
Figure 5O:
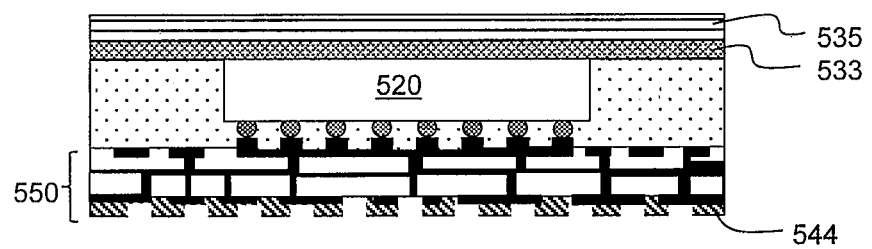
Figure 5P:
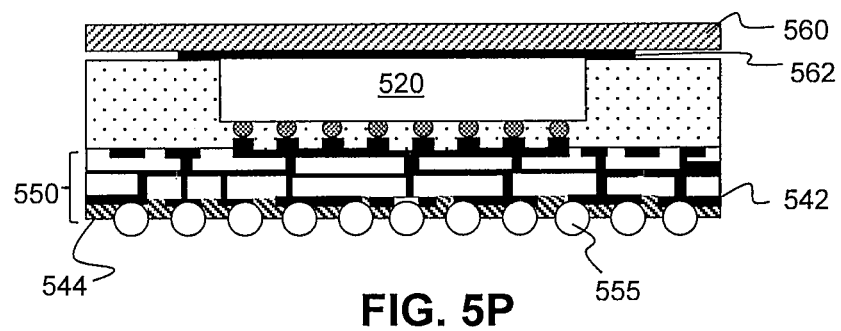

FIGS. 5A-5P show steps for packaging a flip-chip IC in accordance with embodiments of the present invention. FIG. 5A shows conductive layer 514 attached to carrier substrate 510 through adhesive 512. Dry film 516 is etched for bump pad formation in subsequent stages. It should be noted that carrier substrate 510, adhesive 512, conductive layer 514, and dry film 516 may be similar to carrier substrate 310, adhesive 312, conductive layer 314 and dry film 316 shown in FIGS. 3A-3B. After image transfer, metal plating (e.g., Cu plating) may be performed. FIG. 5B shows the structure after metal plating where metal, such as Cu, is formed on conductive layer 514 in areas where dry film 516 has been etched off.

Next, dry film 516 is stripped away to reveal the plated metal on conductive layer 514 (the plated metal may be Cu and in FIG. 5B and FIG. 5C, conductive layer 514 may be a Cu layer). FIG. 5C shows the resulting structure after dry film 516 from FIG. 5B has been stripped away. The plated metal forms multiple bump pads 513 on conductive layer 514. Next, solder printing is performed on the respective bump pads 513. FIG. 5D shows solder bumps 516 on the respective bump pads 514. After solder bumps 516 are formed, an IC die may be placed on the solder bumps. In FIG. 5E, flip-chip IC die 520 is placed on solder bumps 516. Contact pads at the bottom surface of flip-chip IC die 520 may be placed directly adjacent to the corresponding solder bumps 516. Solder bumps 516 connect flip-chip IC die 520 to conductive layer 514. Flip-chip IC die 520 may then be encapsulated in molding compound 505. It should be noted that the top surface of flip-chip IC die 520 may be exposed and not covered by molding compound 505.

After flip-chip IC die 520 has been assembled on carrier substrate 510, carrier substrate 510 may be removed from the assembled die. FIG. 5F shows the resulting structure after carrier substrate 510 and adhesive 512 in FIG. 5E have been stripped away, leaving flip-chip IC die 520, molding compound 505, and conductive layer 514. Next, protective layer 535 is placed on flip-chip IC die 520 and molding compound 505. Alternatively, protective layer 535 may first be placed on flip-chip IC die 520 and molding compound 505 before carrier substrate 510 and adhesive 512 in FIG. 5E are stripped away. As the top surface of flip-chip IC die 520 is exposed (i.e., not covered by molding compound 505), protective layer 535 may be needed to protect flip-chip IC die 520 when the structure is submerged in liquid in subsequent process steps (e.g., image transfer, copper etching, etc.). Protective layer 535 may be a BT layer that is attached to the assembled die through adhesive 533. At this stage, the bottom surface of conductive layer 514 may be laminated with dry film 530. Next, image transfer is performed and FIG. 5H shows the resulting dry film 530 after image transfer. Subsequently, copper etching may be performed and a portion of conductive layer 514 is etched away. FIG. 5I shows the resulting structure with dry film 530 after copper etching has been performed.

Next, dry film 530 is removed or stripped away, leaving the etched conductive layer 514 on the bottom of the assembled flip-chip die, as shown in FIG. 5J. Next, dielectric lamination and laser drilling is performed to form a dielectric layer on the bottom of the assembled flip-chip die. FIG. 5K shows the resulting package structure after at least one dielectric layer 540 has been formed. Metal plating is then performed to form conductive paths 542 in dielectric layer 540, as shown in FIG. 5L. Generally, a package substrate has multiple dielectric layers and as such, multiple dielectric layers 540, with multiple conductive paths (e.g., vias and metal traces) connecting one dielectric layer to another, may be formed in the build-up process. FIG. 5M shows the resulting package structure after subsequent build-up dielectric layers 540 and conductive paths 542 are formed. Solder mask printing may be performed after all the dielectric layers have been formed. FIG. 5N shows the resulting package structure after solder mask printing. In one embodiment, the multiple dielectric layers 540, together with conductive paths 542, and solder mask 544 collectively form a coreless package substrate 550.

Next, photolithography is performed and solder mask 544 is exposed to form openings for solder balls that will be disposed on the bottom of the IC package. FIG. 5O shows the resulting solder mask 544 (with openings) in package substrate 550. At this stage, protective layer 535, together with adhesive 533, on top of flip-chip IC die 520 may be removed. FIG. 5P shows the IC package after the removal of protective layer 535 and adhesive 533 shown in FIGS. 5G-5O. After protective layer 535 has been removed, lid 560 may be attached to flip-chip IC die 520 through non-conductive adhesive 562. Solder balls 555 may accordingly be mounted to the IC package. As shown in FIG. 5P, solder balls 555 are mounted or formed in the respective openings in solder mask 544. As explained above with reference to FIG. 2, signals from flip-chip IC die 520 may travel through routing paths 520 in substrate 550 to solder balls 555.

Figure 6:
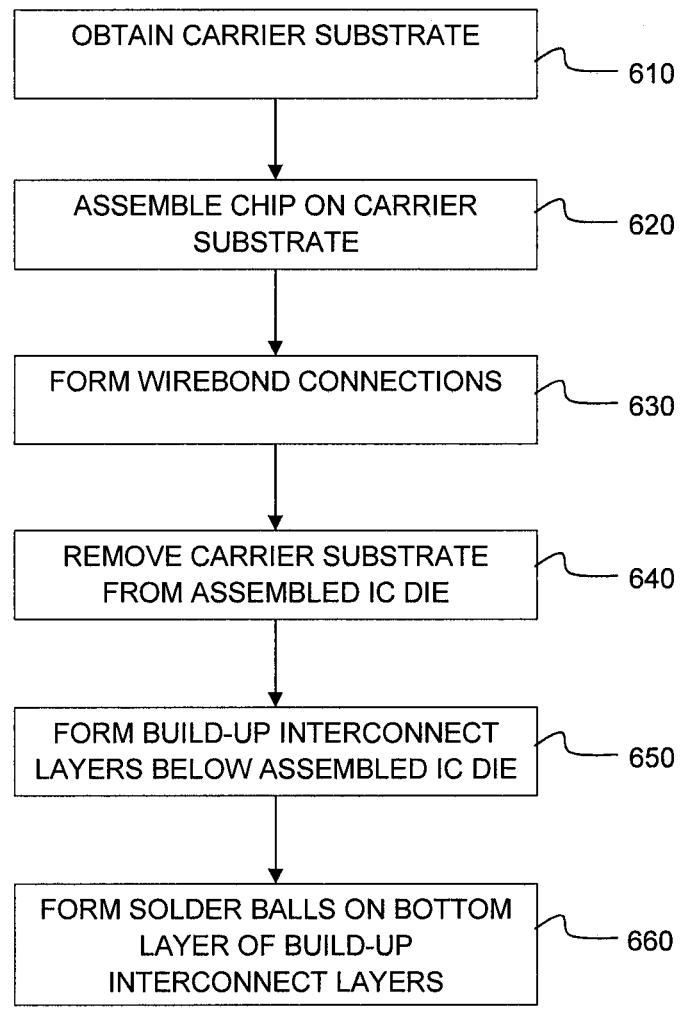
FIG. 6 shows steps for packaging a wirebond IC in accordance with embodiments of the present invention.

FIG. 6 shows steps for packaging a wirebond IC in accordance with embodiments of the present invention. At step 610, a carrier substrate is obtained. An IC die is assembled on the carrier substrate at step 620. At step 630, wirebond connections are formed to connect the IC die to a conductive layer on the carrier substrate. As explained above with reference to FIG. 4D, wirebond IC 320, disposed on carrier substrate 310, is connected to conductive layer 314 via wires 323. The carrier substrate is removed from the assembled chip at step 640. Build-up interconnect layers are formed below the assembled IC die at step 650. At step 660, solder balls are formed on the bottom layer of the build-up interconnect layers. At this stage, the resulting IC package may be similar to the wirebond IC package shown in FIG. 4N.

Figure 7:
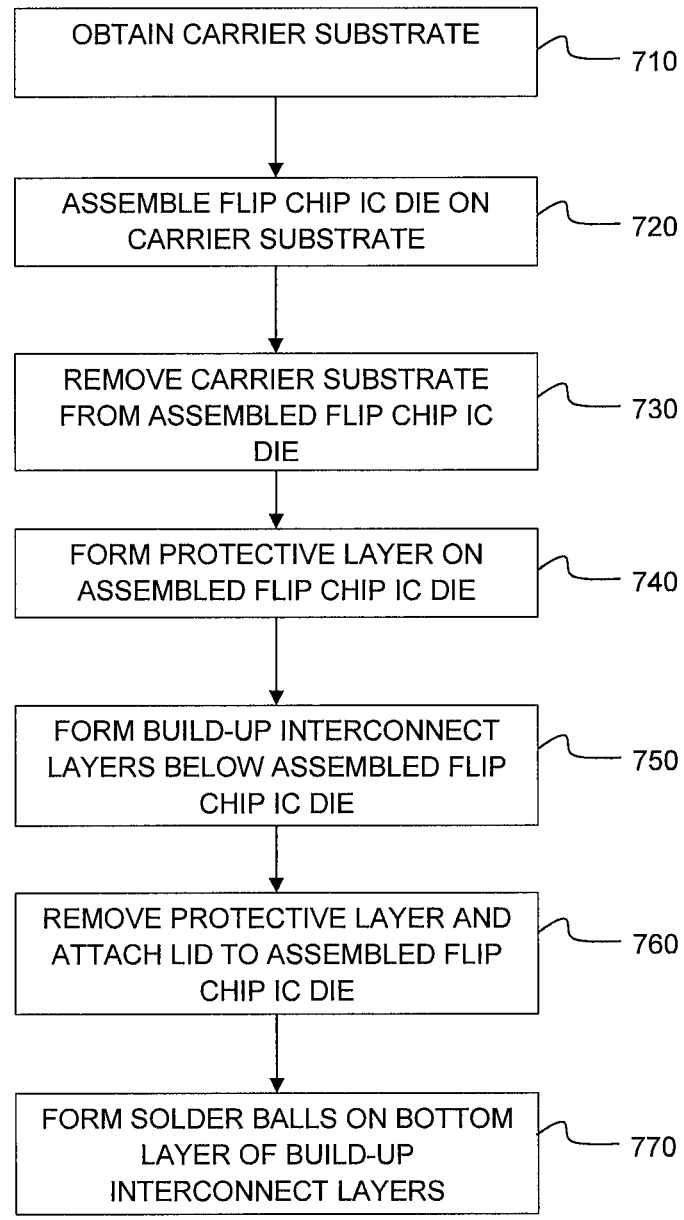
FIG. 7 shows steps for packaging a flip-chip IC in accordance with embodiments of the present invention.

FIG. 7 shows steps for packaging a flip-chip IC die in accordance with embodiments of the present invention. At step 710, a carrier substrate is obtained. A flip-chip IC die is assembled on the carrier substrate at step 720. The carrier substrate is removed from the assembled flip-chip die at step 730. At this stage, the assembled flip-chip die may be similar to flip-chip IC die 520 on carrier substrate 510 as shown in FIG. 5E. Next, at step 740, a protective layer is formed on the assembled flip-chip die. Build-up interconnect layers are then formed below the assembled flip-chip die at step 750. Next, the protective layer is removed and a lid is attached to the assembled flip-chip IC die at step 760. At step 770, solder balls are formed on a bottom layer of the build-up interconnect layers (as explained above with reference to FIG. 5P. It should be noted that in the embodiments of FIGS. 6 and 7, the chip or IC die is assembled on a carrier substrate before the dielectric layers are formed on the bottom of the assembled chip. In one embodiment, the dielectric layers form a coreless package substrate for the IC package and forming the dielectric layers on the assembled chip may reduce warpage in the package substrate.

It should be appreciated that even though specific configurations are shown in the embodiments of FIGS. 4A-4N and FIGS. 5A-5P, different configurations may be employed in this context. The use of flip-chip or wirebond ball grid array IC packages is not meant to be limiting as the techniques described herein may be applied to other packaging configurations (e.g., heat spreader ball grid arrays (HSBGAs), low profile ball grid arrays (LBGAs), thin fine pitch ball grid array (TFBGAs), flip-chip chip-scale packages (FCCSPs), etc).

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit package, comprising:
   a coreless package substrate having a topmost surface and a bottommost surface, wherein the coreless package substrate lacks a core layer and includes only build-up layers and a solder mask layer;
   an integrated circuit die that is mounted on the topmost surface of the coreless package substrate;
   conductive bumps that protrude from the topmost surface of the coreless package substrate and that are formed directly under the integrated circuit die;
   molding compound that encapsulates the integrated circuit die within the integrated circuit package; and
   solder balls that are formed at the bottommost surface of the coreless package substrate.

2. The integrated circuit package of claim 1, further comprising:
   solder bumps interposed between the integrated circuit die and the conductive bumps.

3. The integrated circuit package of claim 1, further comprising:
   a protective layer formed over the integrated circuit die.

4. The integrated circuit package of claim 3, further comprising:
   an adhesive layer interposed between the protective layer and the integrated circuit die.

5. The integrated circuit package of claim 3, wherein the adhesive layer is as wide as the protective layer.

6. The integrated circuit package of claim 1, wherein the integrated circuit die is attached to the coreless package substrate in a flip-chip configuration.

7. The integrated circuit package of claim 1, wherein the build-up layers include interconnect paths formed in dielectric layers.

8. The integrated circuit package of claim 7, wherein the interconnect paths do not protrude above the topmost surface of the coreless package substrate.

9. The integrated circuit package of claim 7, wherein the interconnect paths comprise a patterned conductive layer.

10. The integrated circuit package of claim 9, wherein the conductive layer is patterned after the integrated circuit die has been mounted on the topmost surface.

* * * * *